(12) United States Patent
De Sandre et al.

(10) Patent No.: US 7,835,201 B2
(45) Date of Patent: Nov. 16, 2010

(54) LEVEL-SHIFTER CIRCUIT AND MEMORY DEVICE COMPRISING SAID CIRCUIT

(75) Inventors: Guido De Sandre, Brugherio (IT); Andrea Ambrosino, Milan (IT); Marco Pasotti, Travaco' Siccomario (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 244 days.

(21) Appl. No.: 12/152,660

(22) Filed: May 14, 2008

(65) Prior Publication Data

US 2008/0285359 A1    Nov. 20, 2008

(30) Foreign Application Priority Data

May 15, 2007    (IT) .......................... MI2007A0977

(51) Int. Cl.
*G11C 7/00*    (2006.01)

(52) U.S. Cl. .......................... 365/189.11; 365/185.23; 365/185.18

(58) Field of Classification Search ............ 365/189.11, 365/185.23, 185.18
See application file for complete search history.

(56) References Cited

U.S. PATENT DOCUMENTS

| 6,240,027 B1 * | 5/2001 | Lee et al. ................ 365/189.11 |
| 7,257,031 B2 * | 8/2007 | Darrer .................... 365/185.23 |
| 2007/0279999 A1 * | 12/2007 | Watanabe et al. ...... 365/185.23 |

* cited by examiner

*Primary Examiner*—Connie C Yoha
(74) *Attorney, Agent, or Firm*—Lisa K. Jorgenson; Robert Iannucci; Seed IP Law Group PLLC

(57) ABSTRACT

A level-shifter circuit is adapted for shift an input voltage into an output voltage that is variable between a negative voltage value up to a preset positive voltage level. The shifter circuit includes a first circuit adapted to shift the input voltage into the preset positive voltage level, a second circuit adapted to transfer the preset voltage level to a third circuit connected to a preset negative voltage value. The third circuit is connected to a further voltage at a positive or nil level and is adapted to supply an output voltage to the preset negative level or to the positive or nil level.

33 Claims, 4 Drawing Sheets

LEVEL-SHIFTER CIRCUIT AND MEMORY DEVICE COMPRISING SAID CIRCUIT

CROSS-REFERENCE TO RELATED APPLICATION

This application claims the benefit under 35 U.S.C. §119 (a) of Italian Patent Application No. MI2007A000977, filed May 15, 2007, which application is incorporated herein by reference in its entirety.

BACKGROUND

1. Technical Field

The present invention relates to a level-shifter circuit and a memory device comprising said circuit.

2. Description of the Related Art

In the prior art, level-shifter circuits are known that enable low-voltage devices to interface with high-voltage components.

In particular, so-called negative shifters are known that are suitable for shifting the low-voltage control signals to negative high voltages. Said shifters are often used in memories, especially in the flash memory cells in which particularly negative voltages are used to delete the cells. The result is that the transistors belonging to the negative-level shifters are polarized in stress conditions by the channel oxide. Further, the transistors forming part of the circuitry controlled by the aforesaid shifters have high voltages at the heads of the oxide.

A negative-level shifter is disclosed in the diagram in FIG. 1. Said shifter comprises a pair of PMOS transistors M20-M21 having gate terminals in common and connected to ground GND, source terminals connected to the outputs of two inverters 10 and 11 which are connected in series and have an input signal In, and drain terminals connected to the drain terminals of pair of NMOS transistors M22-M23 having gate terminals in common and source terminals connected to the polarization voltage VNEG. The source terminals of the NMOS transistors M22-M23 are connected to drain terminals of another two NMOS transistors M24, M25 having respective gate terminals connected to the drain terminals of the transistors M25 and M24; and the drain terminal of the transistor M25 is the output OUT of the level-shifter. Said negative level shifter, although it does not have transistors under stress, loses the ability to switch if the voltage VNEG becomes zero.

BRIEF SUMMARY

One embodiment is a level-shifter circuit that, in conditions in which the transistors are not under stress, is able to switch with negative polarization voltages applied that also assume a nil value.

One embodiment is a level-shifter circuit that is suitable for shifting an input voltage into an output voltage that is variable between a negative voltage level up to a positive voltage level, said shifter circuit comprising first means suitable for shifting said input voltage into said positive voltage level, second means suitable for transferring said preset voltage level to third means connected to a negative voltage level, wherein said third means is connected to a further voltage at a positive or nil level and is suitable for providing an output voltage at said preset negative level or at said positive or nil level.

One embodiment is a memory device that includes the level-shifter circuit.

BRIEF DESCRIPTION OF THE SEVERAL VIEWS OF THE DRAWINGS

Certain features and the advantages will become clear from the following detailed disclosure of practical embodiments, illustrated by way of non-limiting example in the attached drawings, in which.

DETAILED DESCRIPTION

Figure 1:
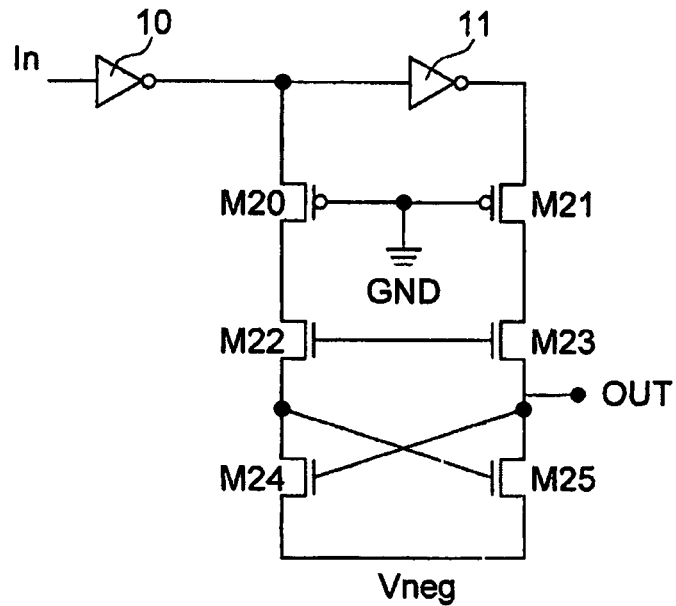
FIG. 1 shows a circuit diagram of a level-shifter according to the prior art.
Figure 2:
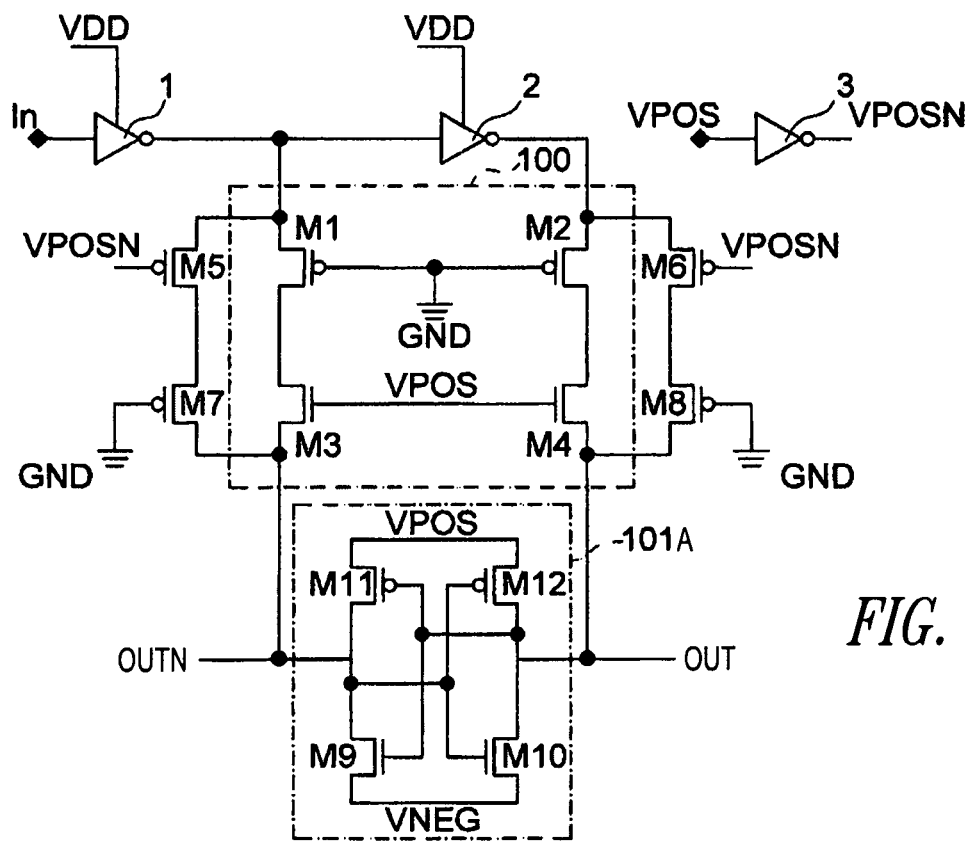
FIG. 2 shows a diagram of a level-shifter circuit according to a first embodiment.

With reference to FIG. 2 there is shown a level-shifter circuit according to a first embodiment. Said shifter comprises a cascode stage 100 including a pair of PMOS transistors M1-M2 having a gate terminal in common connected to ground GND, source terminals connected to the outputs of two low-voltage inverters 1 and 2 which are connected in series and have an input signal In, and drain terminals connected to the drain terminals of another pair of NMOS transistors M3-M4 having a gate terminal in common and connected to the voltage VPOS and source terminals connected to a latch stage 101A; the voltage VPOS may vary between the supply voltage VDD and zero whilst VNEG is a normally negative voltage but may assume a zero value.

The latch stage 101A comprises PMOS transistors M11-M12 that have source terminals connected to the voltage VPOS and respective gate terminals connected to the drain terminals of the transistors M12 and M11. The drain terminal of the transistor M12 is the output terminal OUT of the level-shifter. The latch stage 101A also comprises NMOS transistors M9-M10 that have source terminals connected to the voltage VNEG and respective gate terminals connected to the drain terminals of the transistors M10 and M9 in common with the drain terminals of the transistors M12 and M11. The drain terminal of the transistor M9 is the output OUTN of the level-shifter. The drain terminals of the transistors M9, M11 and M10, M12 are connected to the respective source terminals of the transistors M3 and M4.

With the circuit in FIG. 2 it is possible to zero the voltage VPOS, i.e., the positive supply of the latch stage 101A, if the negative voltage VNEG falls below a preset level, so that neither the transistors of the shifter nor the transistors downstream suffer stress, as the high logic status corresponds to ground. In this case the output OUT of the shifter remains in the same status prior to the decrease of the positive supply without losing the possibility of switching in such a condition.

More in detail, the transistors M1, M2, M3 and M4 protect the low-voltage inverters 1 and 2 from the high voltages. If VPOS=0, the nodes OUT and OUTN have dynamics comprised between zero and VNEG by eliminating all stress problems for all the transistors connected to the nodes. In this latter condition the transistors M3 and M4, in cascode configuration, protect the transistors M9 and M10 from overvoltage.

The latch 101A, in addition to maintaining the information in the condition VPOS=0, means that the nodes OUT and OUTN have a high logic level that is exactly equal to VPOS, which would not occur due to NMOS transistors M3 and M4, which would limit upper dynamics to VPOS less a threshold.

The topology proposed here enables a negative level shifter to be obtained that can operate supplied between VDD and 0, between VDD and VNEG and also between 0 and VNEG if the positive voltage is zeroed in order to reduce transistor stress.

Preferably, the level-shifter in FIG. 2 comprises the pair of PMOS transistors M5, M7 arranged between the source terminal of the transistor M1 and the source terminal of the transistor M3 and the pair of PMOS transistors M6, M8 arranged between the source terminal of the transistor M2 and the source terminal of the transistor M4. The transistors M5 and M6 are driven by the voltage VPOSN that is the logical reverse of the voltage VPOS and produced by an inverter 3, whilst the gate terminals of the transistors M7 and M8 are connected to ground. Said transistors, with VPOS=VDD, ensure that the nodes OUT and OUTN have full dynamics between VDD and VNEG and further ensure that the driving dynamics of the nodes reaches the voltage VDD.

Variants have been developed to address the problems linked with the wide range of supplies for which it is necessary to ensure the functionality of the shifter and the progressive decrease of overdrives due to the reduction of the supply voltages of the low-voltage parts and the accompanying non-variance of the threshold voltages of the high voltage transistors.

Figure 3:
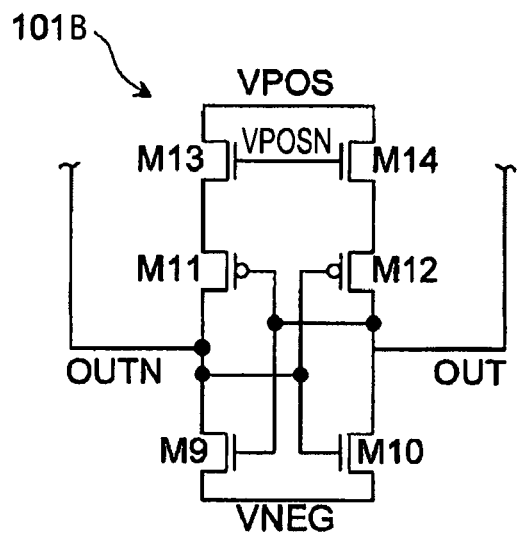
FIG. 3 shows a diagram of a level-shifter circuit according to a variant of the first embodiment.

In FIG. 3 there is shown an alternate latch stage 101B of a level-shifter according to a variant of the first embodiment. With respect to the level-shifter in FIG. 2, in latch stage 101B two transistors M13 and M14 have been introduced having gate terminals connected to the voltage VPOSN, source terminals connected to the source terminals of the PMOS transistors M11 and M12 and drain terminals connected to the voltage VPOS. In order to be able to ensure switching of the shifter within an acceptable time for all operating conditions (temperature and process parameters) both if VNEG is 0 or −9V, two transistors have been introduced that activate the PMOS transistors M11 and M12 only when VPOS is at 0. In this manner, for switching, the PMOS of the latch do not have to be overcome if not strictly necessary.

In the case of extremely low supply voltages VDD, switching time is greatly slowed by the disproportion between the conductibility of the PMOS transistors M1 and M2, which have maximum voltage VGS equal to VDD, and the NMOS transistors of the latch 101 that have the voltage VGS equal to VNEG and then to 9V. This disproportion becomes problematic especially for minimum and low-temperature VDD voltages, for example −40° C., i.e., when the transconductance of the transistors is maximum.

In order to address this problem, it is useful to increase the overdrive of the transistors M1 and M2. For this purpose, two types of level shifters are proposed according to second and third embodiments that are shown in FIGS. 4 and 5.

Figure 4:
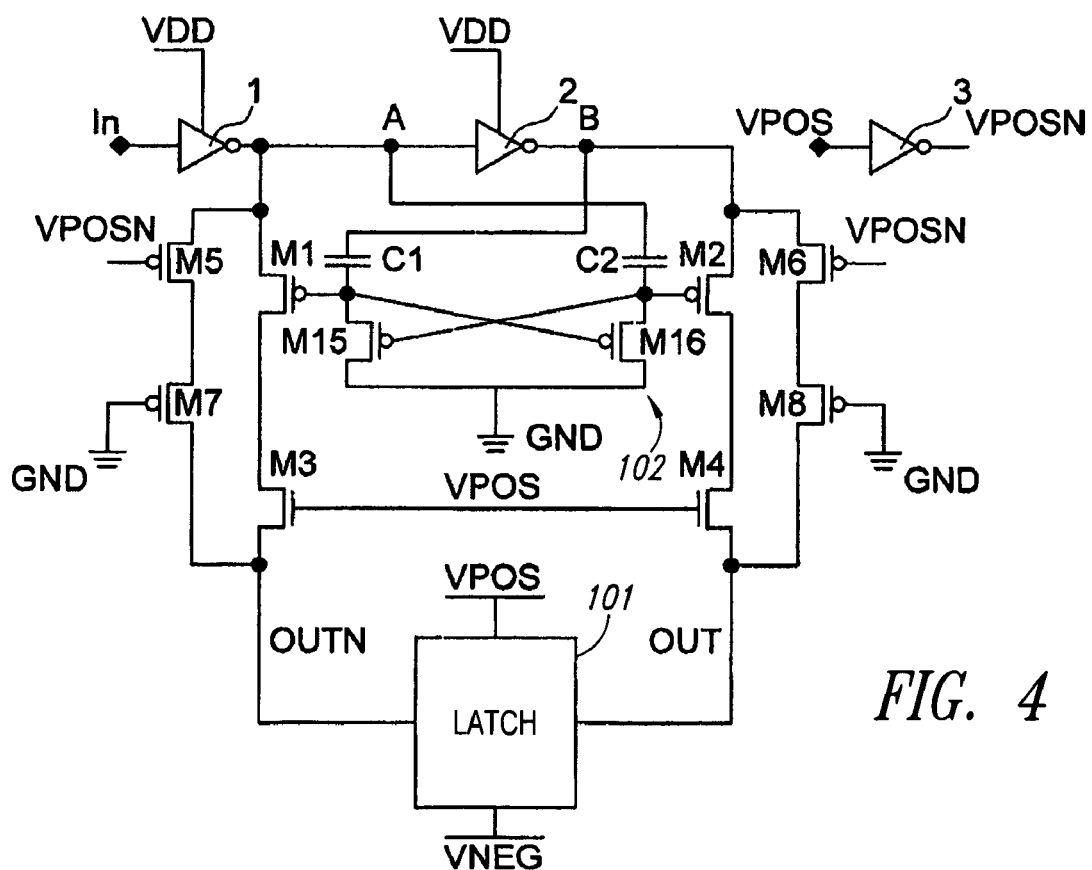
FIG. 4 shows a diagram of a level-shifter circuit according to a second embodiment.
Figure 5:
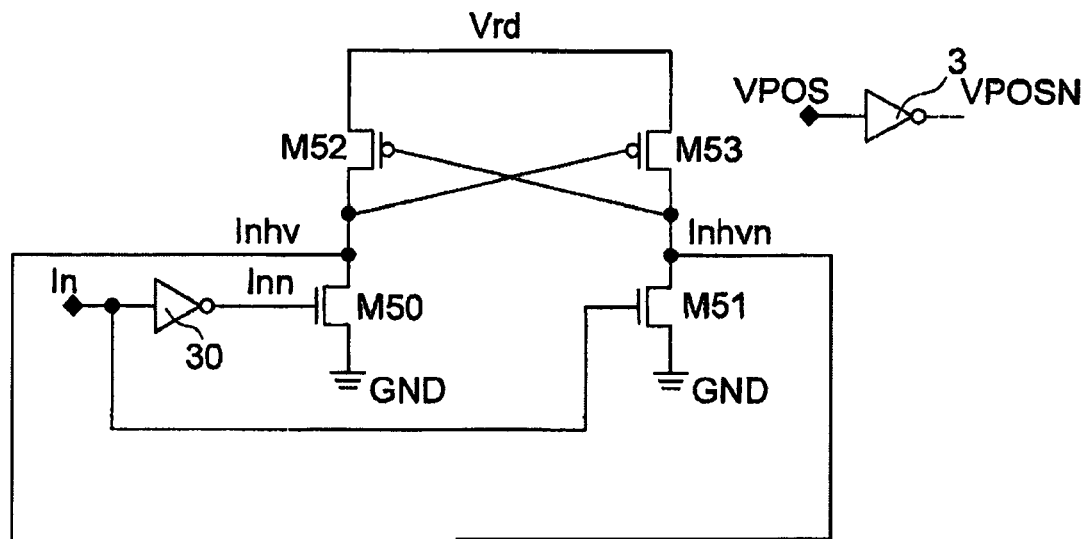
FIG. 5 shows a diagram of a level-shifter circuit according to a third embodiment.
Figure 5:
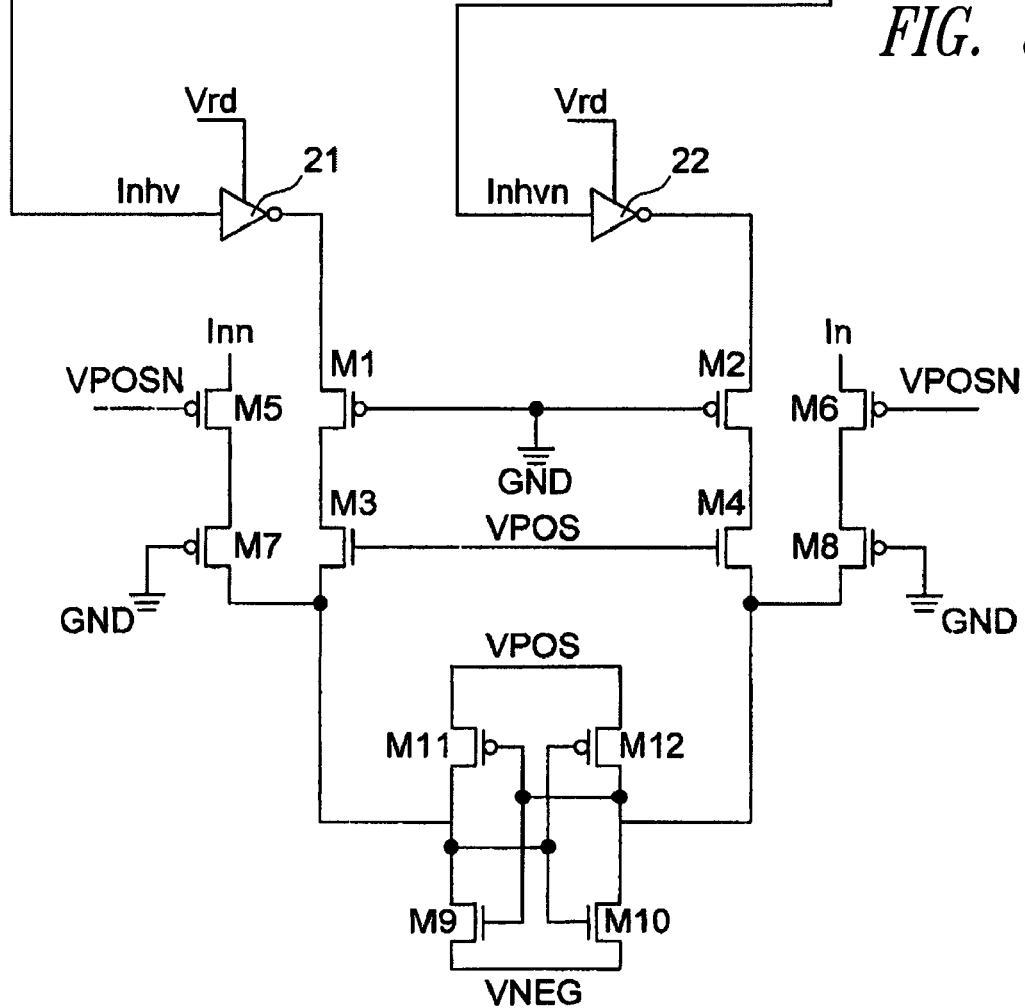

In FIG. 4 there is shown a level shifter according to a second embodiment. Said shifter differs from the shifter in FIG. 2 due to the presence of the stage 102. Said stage 102 is connected between the gate terminals of the transistors M1 and M2 and between the input A and the output B of the inverter 2. The stage 102 comprises a latch formed by the PMOS transistors M15 and M16 having respective gate terminals connected to the source terminals of the transistors M16 and M15 and having drain terminals in common and connected to ground GND. The source terminals of the transistors M15 and M16 are connected to two capacitors C1 and C2 connected respectively to the input terminal A and to the output terminal B of the inverter 2.

The shifter in FIG. 4 exploits a boost mechanism for lowering to voltage below ground the gates of the transistors M1 and M2. In fact, when the node A is at the voltage VDD the capacitor C2 is charged to VDD. Upon switching of the input, with the signal In at high voltage, the terminal A is at ground, taking the gate of the transistor M2 to voltage below zero, thus increasing the overdrive of the transistor and thus the speed with which the node OUT increases.

For this embodiment there is a problem linked to the status of the two capacitors when the circuit is switched on. Or when the supply voltage VDD increases, if the node A is high, the capacitor C2 has to be charged at VDD, but the gate terminal of the transistor M2 is not maintained at ground because the transistor M10 is turned on. To overcome this drawback, it is possible to place, parallel to the transistors M15 and M16, resistances that discharge the gates of the transistors M1 and M2. This solution introduces a leakage current that would discharge C1 and C2 during the boost step but this does not influence the switching of the shifter, which occurs during the first nanoseconds of this step.

Preferably, the level-shifter in FIG. 4, like the level-shifter in FIG. 2, comprises the pair of PMOS transistors M5, M7, arranged between the source terminal of the transistor M1 and the source terminal of the transistor M3, the pair of PMOS transistors M6, M8 between the source terminal of the transistor M2 and the source terminal of the transistor M4, and a latch 101 corresponding to one of the latches 101A, 101B. The transistors M5 and M6 are driven by the voltage VPOSN, which is the reverse of the voltage VPOS, whilst the gate terminals of the transistors M7 and M8 are connected to ground. Said transistors, with VPOS=VDD mean that the nodes OUT and OUTN have full dynamics between VDD and VNEG.

In FIG. 5 there is shown a level-shifter according to the third embodiment. In order to increase the overdrive of M1 and M2 it is possible to exploit greater positive voltage than the voltage VDD, which is commonly present in flash memories, having available, for example, the reading voltage Vrd. In this manner it is possible to increase the dynamics of the signal that commands the transistors M1 and M2 with a positive level-shifter between ground and the voltage Vrd (with Vrd>Vdd). This is made possible by the fact that a structure is implemented that decouples the negative high voltages from the positive voltages, preventing all stress on the channel oxides.

Said level-shifter of FIG. 5 comprises, compared with the shifter in FIG. 2, two different low-voltage inverters 21 and 22 supplied between the voltage Vrd and ground GND instead of the inverters 1 and 2 in FIG. 2. In FIG. 5 it is shown that the input signal In is sent to a low-voltage inverter 30 which has the output signal Inn. The signals In and Inn drive the gates of two NMOS transistors M50 and M51 having source terminals connected to ground GND and drain terminals connected to the drain terminals of two PMOS transistors M52 and M53 having source terminals connected to the voltage Vrd and gate terminals connected respectively to the drain terminals of the transistors M53 and M52. On the drain terminals of the transistors M50 and M51 there are the signals Inhv and Inhvn that are sent in input to the inverters 21 and 22.

As for the circuit in FIG. 2, the level-shifter in FIG. 5 preferably comprises the pairs of the PMOS transistors M5, M7 and M6, M8, arranged respectively between the voltage Inn and the source terminal of the transistor M3 and between the voltage In and the source terminal of the transistor M4.

The transistors M5 and M6 are driven by the voltage VPOSN that is the reverse of the voltage VPOS whilst the gate terminals of the transistors M7 and M8 are connected to ground. Said transistors, with VPOS=VDD, ensure that the nodes OUT and OUTN have full dynamics between VDD and VNEG and, further, that the driving dynamics of the nodes reaches the voltage VDD.

For the level-shifter in FIG. 5 it is also possible that the voltage VPOS=Vrd and that the PMOS transistors M5, M7 are arranged between the voltage Inhvn and the source terminal of the transistor M3 and PMOS transistors M6, M8 are arranged between the voltage Inhv and the source terminal of the transistor M4; in this case the nodes OUT and OUTN have full dynamics between Vrd and VNEG and, further, the driving dynamics of such nodes reaches the voltage Vrd.

The variant of the first embodiment shown in FIG. 3 can be used in the level shifters in FIGS. 4 and 5.

Figure 6:
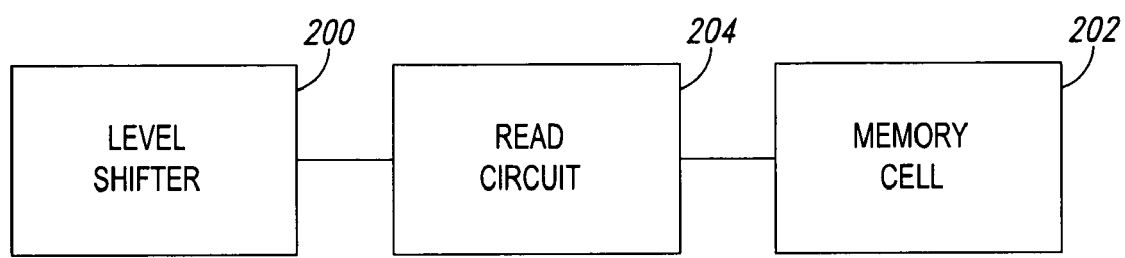
FIG. 6 is a block diagram of a memory device according to one embodiment.

A memory device according to one embodiment is shown in FIG. 6. The memory device includes a level shifter 200, such as one of the level shifters shown in FIGS. 2-5. The memory device also includes a memory cell 202 of a memory array, and a read circuit 204 configured to provide to the cell 202 the voltage Vrd as a reading voltage that is greater than the supply voltage VDD.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A level-shifter circuit, comprising:
   first means for shifting an input voltage into a positive first voltage;
   second means for transferring said first voltage; and
   third means for receiving a negative voltage, a second voltage at a positive level or nil level, and the first voltage, and for providing an output voltage that is selected from said negative voltage and said second voltage, wherein said second means comprises a cascode structure comprising a pair of transistors including a first transistor configured to be controlled by the said second voltage.

2. The circuit of claim 1, wherein said cascode structure comprises a PMOS second transistor having a gate terminal configured to be connected to ground and the first transistor is an NMOS transistor having a gate terminal configured to be connected to said second voltage.

3. The circuit of claim 1, wherein said third means comprises a latch circuit comprising a pair of first and second NMOS transistors and a pair of first and second PMOS transistors, the first NMOS and first PMOS transistors having respective gate terminals connected as a first common gate terminal and respective drain terminals connected as a first common drain terminal, the second NMOS and second PMOS transistors respective gate terminals connected as a second common gate terminal and respective drain terminals connected as a second common drain terminal, the NMOS transistors having respective source terminals configured to be connected to said negative voltage, the PMOS transistors having respective source terminals configured to be connected to said second voltage, the first common gate terminal being connected to the second common drain terminal, the second common gate terminal being connected to the first common drain terminal, and the second common drain terminal being an output terminal of the shifter circuit.

4. The circuit of claim 3, wherein said third means comprises first and second MOS transistors configured to be respectively arranged between said second voltage and said first and second PMOS transistors, the first and second MOS transistors being configured to directly connect said second voltage to said first and second PMOS transistors only when the second voltage assumes the nil level.

5. The circuit of claim 4, further comprising a cascode structure comprising a pair of PMOS transistors having respective gate terminals configured to be connected to ground when said second voltage assumes a positive value, said cascode structure being configured to be connected to said third means and to a supply voltage of the circuit or to ground.

6. The circuit of claim 1, further comprising means for ensuring that the output voltage reaches said first voltage when said second voltage is at the positive level.

7. The circuit of claim 1, further comprising other means for increasing the conductibility of said second means.

8. The circuit of claim 7, wherein said second means comprises a cascode structure comprising an NMOS first transistor configured to be driven by said second voltage and a PMOS second transistor having a gate terminal configured to be connected to ground, and said other means comprises circuitry configured to lower a voltage at the gate terminal of the PMOS second transistor below ground.

9. The circuit of claim 1, wherein said shifter circuit is supplied by a supply voltage and said first voltage is the supply voltage of the circuit.

10. The circuit of claim 1, wherein said shifter circuit is supplied by a supply voltage and said first voltage is a greater voltage than the supply voltage.

11. The circuit of claim 1, wherein said first means comprises an inverter configured to be supplied between ground and said first voltage.

12. The circuit of claim 1 wherein said input signal is a logic signal.

13. A memory device, comprising:
    a memory cell; and
    a level-shifter circuit coupled to the memory cell and including:
    first means for shifting an input voltage into a positive first voltage;
    second means for transferring said first voltage; and
    third means for receiving a negative voltage, a second voltage at a positive level or nil level, and the first voltage, and for providing an output voltage that is selected from said negative voltage and said second voltage, wherein said second means comprises a cascode structure comprising an NMOS first transistor having a gate terminal configured to be driven by said second voltage and a PMOS second transistor having a gate terminal configured to be connected to ground.

14. The memory device according to claim 13, further comprising means for providing a reading voltage to the cell that is greater than a supply voltage, said reading voltage being said first voltage.

15. The memory device according to claim 13, wherein said third means comprises a latch circuit comprising a pair of first and second NMOS transistors and a pair of first and second PMOS transistors, the first NMOS and first PMOS transistors having respective gate terminals connected as a first common gate terminal and respective drain terminals connected as a first common drain terminal, the second NMOS and second PMOS transistors respective gate terminals connected as a second common gate terminal and respective drain terminals connected as a second common drain terminal, the NMOS transistors having respective source terminals configured to be connected to said negative voltage, the PMOS transistors having respective source terminals configured to be connected to said second voltage, the first common gate terminal being connected to the second common drain terminal, the second common gate terminal being connected to the first common drain terminal, and the second common drain terminal being an output terminal of the shifter circuit.

16. The memory device according to claim 15, wherein said third means comprises first and second MOS transistors configured to be respectively arranged between said second voltage and said first and second PMOS transistors, the first and second MOS transistors being configured to directly connect said second voltage to said first and second PMOS transistors only when the second voltage assumes the nil level.

17. The memory device according to claim 16, wherein the level-shifter includes a cascode structure comprising a pair of PMOS transistors having respective gate terminals configured to be connected to ground when said second voltage assumes a positive value, said cascode structure being configured to be connected to said third means and to a supply voltage of the circuit or to ground.

18. The memory device according to claim 13, wherein the level-shifter includes means for ensuring that the output voltage reaches said first voltage when said second voltage is at the positive level.

19. The memory device according to claim 13, wherein said second means comprises a cascode structure comprising an NMOS first transistor configured to be driven by said second voltage, a PMOS second transistor having a gate terminal configured to be connected to ground, and circuitry configured to lower a voltage at the gate terminal of the PMOS second transistor below ground.

20. A level-shifter circuit, comprising:
a shifter configured to shift an input voltage into a positive first voltage;
a latch configured to produce, at an output terminal, an output voltage selected from a negative voltage and a second voltage having either a positive level or a nil level; and
a first cascode structure coupling the latch to the shifter, the first cascode structure including a first PMOS transistor and a first NMOS transistor cascade connected between the level shifter and an input terminal of the latch, the first NMOS transistor having a gate terminal configured to be coupled to the second voltage.

21. The circuit of claim 20, wherein the latch includes:
a second NMOS transistor and a second PMOS transistor having respective gate terminals connected as a first common gate terminal and respective drain terminals connected as a first common drain terminal; and
a third NMOS transistor and a third PMOS transistor having respective gate terminals connected as a second common gate terminal and respective drain terminals connected as a second common drain terminal, the second and third NMOS transistors having respective source terminals configured to be connected to the negative voltage, the second and third PMOS transistors having respective source terminals configured to be connected to the second voltage, the first common gate terminal being connected to the second common drain terminal, the second common gate terminal being connected to the first common drain terminal, and the second common drain terminal being an output terminal at which the output voltage is produced.

22. The circuit of claim 21, wherein the latch further includes a first MOS transistor configured to be arranged between said second voltage and said second PMOS transistor and a second MOS transistor configured to be arranged between said second voltage and said third PMOS transistor, the first and second MOS transistors being configured to directly connect said second voltage to said second and third PMOS transistors only when the second voltage assumes the nil level.

23. The circuit of claim 21, further comprising a fourth PMOS transistor configured to be coupled between the first voltage and a source of the first NMOS transistor and having a gate terminal configured to be coupled to the second voltage.

24. The circuit of claim 20, wherein the shifter includes a first inverter having an input configured to be coupled to the input voltage and an output at which the first voltage is produced, the level-shifter further comprising:
a second inverter having an input and an output, the input of the second inverter being coupled to the output of the first inverter;
a second cascode structure coupled between the output of the second inverter and the output terminal of the latch, the second cascode structure including a second PMOS transistor and a second NMOS transistor cascade connected between the output of the second inverter and the output terminal of the latch, the second NMOS transistor having a gate terminal connected in common to the gate terminal of the first NMOS transistor.

25. The circuit of claim 24, further comprising:
a first capacitor coupled between the output of the second inverter and a gate terminal of the first PMOS transistor;
a second capacitor coupled between the output of the first inverter and a gate terminal of the second PMOS transistor;
a third PMOS transistor coupled between the gate terminal of the first PMOS transistor and ground, the third PMOS transistor having a gate terminal coupled to the gate terminal of the second PMOS transistor; and
a fourth PMOS transistor coupled between the gate terminal of the second PMOS transistor and ground, the fourth PMOS transistor having a gate terminal coupled to the gate terminal of the first PMOS transistor.

26. A level-shifter circuit, comprising:
first means for shifting an input voltage into a positive first voltage;
second means for transferring said first voltage; and
third means for receiving a negative voltage, a second voltage at a positive level or nil level, and the first voltage, and for providing an output voltage that is selected from said negative voltage and said second voltage, wherein said third means comprises a latch circuit comprising a pair of first and second NMOS transistors and a pair of first and second PMOS transistors, the first NMOS and first PMOS transistors having respective gate terminals connected as a first common gate terminal and respective drain terminals connected as a first common drain terminal, the second NMOS and second PMOS transistors respective gate terminals connected as a second common gate terminal and respective drain terminals connected as a second common drain terminal, the NMOS transistors having respective source terminals configured to be connected to said negative voltage, the PMOS transistors having respective source terminals configured to be connected to said second voltage, the first common gate terminal being connected to the second common drain terminal, the second common gate terminal being connected to the first common drain terminal, and the second common drain terminal being an output terminal of the shifter circuit.

27. The level shifter circuit in claim 26, wherein said third means comprises first and second MOS transistors configured to be respectively arranged between said second voltage and said first and second PMOS transistors, the first and second MOS transistors being configured to directly connect said second voltage to said first and second PMOS transistors only when the second voltage assumes the nil level.

28. A level-shifter circuit, comprising:
first means for shifting an input voltage into a positive first voltage;
second means for transferring said first voltage;
third means for receiving a negative voltage, a second voltage at a positive level or nil level, and the first voltage, and for providing an output voltage that is selected from said negative voltage and said second voltage; and
other means for increasing the conductibility of said second means, wherein said second means comprises a cascode structure comprising an NMOS first transistor configured to be driven by said second voltage and a PMOS second transistor having a gate terminal configured to be connected to ground, and said other means comprises circuitry configured to lower a voltage at the gate terminal of the PMOS second transistor below ground.

29. The level-shifter circuit of claim 28, wherein said third means comprises a latch circuit comprising a pair of first and second NMOS transistors and a pair of first and second PMOS transistors, the first NMOS and first PMOS transistors having respective gate terminals connected as a first common gate terminal and respective drain terminals connected as a first common drain terminal, the second NMOS and second PMOS transistors respective gate terminals connected as a second common gate terminal and respective drain terminals connected as a second common drain terminal, the first and second NMOS transistors having respective source terminals configured to be connected to said negative voltage, the first and second PMOS transistors having respective source terminals configured to be connected to said second voltage, the first common gate terminal being connected to the second common drain terminal, the second common gate terminal being connected to the first common drain terminal, and the second common drain terminal being an output terminal of the shifter circuit.

30. A memory device, comprising:
a memory cell; and
a level-shifter circuit coupled to the memory cell and including:
first means for shifting an input voltage into a positive first voltage;
second means for transferring said first voltage; and
third means for receiving a negative voltage, a second voltage at a positive level or nil level, and the first voltage, and for providing an output voltage that is selected from said negative voltage and said second voltage, wherein said third means comprises a latch circuit comprising a pair of first and second NMOS transistors and a pair of first and second PMOS transistors, the first NMOS and first PMOS transistors having respective gate terminals connected as a first common gate terminal and respective drain terminals connected as a first common drain terminal, the second NMOS and second PMOS transistors respective gate terminals connected as a second common gate terminal and respective drain terminals connected as a second common drain terminal, the NMOS transistors having respective source terminals configured to be connected to said negative voltage, the PMOS transistors having respective source terminals configured to be connected to said second voltage, the first common gate terminal being connected to the second common drain terminal, the second common gate terminal being connected to the first common drain terminal, and the second common drain terminal being an output terminal of the shifter circuit.

31. The memory device according to claim 30, wherein said third means comprises first and second MOS transistors configured to be respectively arranged between said second voltage and said first and second PMOS transistors, the first and second MOS transistors being configured to directly connect said second voltage to said first and second PMOS transistors only when the second voltage assumes the nil level.

32. A memory device, comprising:
a memory cell; and
a level-shifter circuit coupled to the memory cell and including:
first means for shifting an input voltage into a positive first voltage;
second means for transferring said first voltage; and
third means for receiving a negative voltage, a second voltage at a positive level or nil level, and the first voltage, and for providing an output voltage that is selected from said negative voltage and said second, wherein said second means comprises a cascode structure comprising an NMOS first transistor configured to be driven by said second voltage, a PMOS second transistor having a gate terminal configured to be connected to ground, and circuitry configured to lower a voltage at the gate terminal of the PMOS second transistor below ground.

33. The memory device of claim 32, wherein said third means comprises a latch circuit comprising a pair of first and second NMOS transistors and a pair of first and second PMOS transistors, the first NMOS and first PMOS transistors having respective gate terminals connected as a first common gate terminal and respective drain terminals connected as a first common drain terminal, the second NMOS and second PMOS transistors respective gate terminals connected as a second common gate terminal and respective drain terminals connected as a second common drain terminal, the first and second NMOS transistors having respective source terminals configured to be connected to said negative voltage, the first and second PMOS transistors having respective source terminals configured to be connected to said second voltage, the first common gate terminal being connected to the second common drain terminal, the second common gate terminal being connected to the first common drain terminal, and the second common drain terminal being an output terminal of the shifter circuit.

* * * * *